US012757470B2

(12) United States Patent
Kwon et al.

(10) Patent No.: US 12,757,470 B2
(45) Date of Patent: Oct. 6, 2026

(54) SEMICONDUCTOR DEVICE AND METHOD OF MANUFACTURING THE SAME

(71) Applicant: SEMES CO., LTD., Cheonan-si (KR)

(72) Inventors: Thomas Jongwan Kwon, Cheonan-si (KR); Hae-Won Choi, Cheonan-si (KR); Yunsang Kim, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 508 days.

(21) Appl. No.: 18/218,751

(22) Filed: Jul. 6, 2023

(65) Prior Publication Data

US 2024/0072142 A1 Feb. 29, 2024

(51) Int. Cl.
*H10P 50/26* (2026.01)
*H10D 64/27* (2025.01)

(52) U.S. Cl.
CPC ......... *H10D 64/513* (2025.01); *H10P 50/268* (2026.01)

(58) Field of Classification Search
CPC .................................................... H10D 64/513
See application file for complete search history.

(56) References Cited

U.S. PATENT DOCUMENTS

| | | | | |
|---|---|---|---|---|
| 8,026,176 | B2 | 9/2011 | Sakuma et al. | |
| 8,610,191 | B2 | 12/2013 | Moon et al. | |
| 9,330,939 | B2 | 5/2016 | Zope et al. | |
| 10,741,643 | B2 | 8/2020 | Ryu | |
| 10,923,359 | B2 | 2/2021 | Seidel et al. | |
| 10,991,807 | B2 | 4/2021 | Nam | |
| 11,069,535 | B2 | 7/2021 | Lai et al. | |
| 2010/0210105 | A1 | 8/2010 | Baek et al. | |
| 2011/0003468 | A1* | 1/2011 | Song .................... | H10D 64/513 438/589 |
| 2016/0056160 | A1* | 2/2016 | Jang ....................... | H10B 12/34 257/331 |
| 2017/0040214 | A1* | 2/2017 | Lai .................... | H01L 21/32136 |
| 2020/0168611 | A1* | 5/2020 | Jeon ........................ | H10B 12/34 |
| 2021/0082767 | A1* | 3/2021 | Kim ...................... | H10D 64/513 |
| 2021/0183865 | A1* | 6/2021 | Neelapala ............ | H10B 12/053 |

FOREIGN PATENT DOCUMENTS

| | | | |
|---|---|---|---|
| KR | 10-2008-0090559 | A | 10/2008 |
| KR | 101662282 | B1 | 10/2016 |
| KR | 10-2019-0101195 | A | 8/2019 |
| KR | 10-2020-0033025 | A | 3/2020 |
| KR | 10-2021-0125967 | A | 10/2021 |

* cited by examiner

*Primary Examiner* — Erik Kielin
(74) *Attorney, Agent, or Firm* — Muir Patent Law, PLLC

(57) ABSTRACT

Provided is a method of manufacturing a semiconductor device, the method including steps of providing a semiconductor substrate having one or more trenches, forming a gate insulating layer on the semiconductor substrate inside the trenches, and forming a buried gate electrode layer on the gate insulating layer to at least partially fill the trenches, wherein the step of forming the buried gate electrode layer includes a step of repeating a unit cycle a plurality of times, the unit cycle including an atomic layer deposition (ALD) process for forming a conductive layer on the gate insulating layer to serve as the buried gate electrode layer, and an atomic layer etching (ALE) process for preferentially etching portions of the conductive layer formed near the trenches and portions of the conductive layer formed on upper ends of the trenches over other portions of the conductive layer inside the trenches.

4 Claims, 8 Drawing Sheets

SEMICONDUCTOR DEVICE AND METHOD OF MANUFACTURING THE SAME

CROSS-REFERENCE TO RELATED PATENT APPLICATION

This application claims the benefit of Korean Patent Application No. 10-2022-0106877, filed on Aug. 25, 2022, in the Korean Intellectual Property Office, the disclosure of which is incorporated herein in its entirety by reference.

BACKGROUND OF THE INVENTION

1. Field of the Invention

The present invention relates to semiconductor manufacturing and, more particularly, to a semiconductor device and a method of manufacturing the same.

2. Description of the Related Art

Because semiconductor devices require a high degree of integration and high-performance operation, a gate structure thereof is changed from a planar structure on a semiconductor substrate to a recessed structure buried in the semiconductor substrate. Furthermore, the recessed gate structure is filled with dual conductive materials.

Therefore, a process of burying and etching a conductive material is used to form the recessed gate structure. However, in the process of burying the conductive material to form the general recessed gate structure, side wall lines of trenches may be bent due to an attractive force acting at upper ends of the trenches. Furthermore, due to high-energy plasma ions used to etch the conductive material, plasma damage to the semiconductor substrate may be caused and process costs may be raised.

SUMMARY OF THE INVENTION

The present invention provides a highly reliable semiconductor device capable of lowering process costs and reducing substrate damage, and a method of manufacturing the same. However, the above description is merely an example, and the scope of the present invention is not limited thereto.

According to an aspect of the present invention, there is provided a method of manufacturing a semiconductor device, the method including steps of providing a semiconductor substrate having one or more trenches, forming a gate insulating layer on the semiconductor substrate inside the one or more trenches, and forming a buried gate electrode layer on the gate insulating layer to at least partially fill the one or more trenches, wherein the step of forming the buried gate electrode layer includes a step of repeating a unit cycle a plurality of times, the unit cycle including an atomic layer deposition (ALD) process for forming a conductive layer on the gate insulating layer to serve as the buried gate electrode layer, and an atomic layer etching (ALE) process for preferentially etching portions of the conductive layer formed near the one or more trenches and portions of the conductive layer formed on upper ends of the one or more trenches over other portions of the conductive layer inside the one or more trenches.

The ALE process within the unit cycle may include steps of adsorbing an etchant onto the conductive layer, and removing portions of the conductive layer from the semiconductor substrate by activating portions of the etchant adsorbed onto the conductive layer by supplying ions onto the conductive layer in a direction perpendicular to the semiconductor substrate.

The etchant may include a halogen-containing gas.

The step of adsorbing the etchant may include a step of supplying a first purge gas onto the semiconductor substrate after the step of supplying the etchant onto the semiconductor substrate, and the step of removing the portions of the conductive layer may include a step of supplying a second purge gas onto the semiconductor substrate after the step of supplying the ions onto the semiconductor substrate.

The first and second purge gases may include an inert gas.

The ions supplied during the ALE process may have an energy lower than or equal to 10 eV (and higher than 0 eV).

The ions may include argon (Ar) ions.

In the step of removing the portions of the conductive layer, the ions may activate portions of the etchant adsorbed onto the conductive layer near the one or more trenches, portions of the etchant adsorbed onto the conductive layer on upper side walls of the one or more trenches, and portions of the etchant adsorbed onto the conductive layer on lower ends of the one or more trenches, based on an ion bombardment effect, and the activated portions of the etchant may preferentially remove portions of the conductive layer near the one or more trenches, portions of the conductive layer on the upper side walls of the one or more trenches, and portions of the conductive layer on the lower ends of the one or more trenches over other portions of the conductive layer.

The one or more trenches may be further defined by a hard mask layer formed on the semiconductor substrate outside the one or more trenches, in the ALD process, the conductive layer may be further formed on the hard mask layer, and, in the ALE process, portions of the conductive layer formed on the hard mask layer may be removed.

The step of forming the buried gate electrode layer may further include a step of performing wet etching to etch portions of the conductive layer remaining on both side walls at the upper ends of the one or more trenches after the step of repeating the unit cycle the plurality of times.

The step of forming the buried gate electrode layer may further include a step of forming a polysilicon layer on the conductive layer to fill the one or more trenches.

Lower portions of the one or more trenches may have a U shape.

In the step of repeating the unit cycle the plurality of times, a time of the ALD process within the unit cycle may be adjusted in such a manner that portions of the conductive layer on both side walls at the upper ends of the one or more trenches are not in contact with but spaced apart from each other.

According to another aspect of the present invention, there is provided a semiconductor device including a semiconductor substrate having one or more trenches, a gate insulating layer formed on the semiconductor substrate inside the one or more trenches, and a buried gate electrode layer formed on the gate insulating layer to at least partially fill the one or more trenches, wherein the buried gate electrode layer is formed by repeating a unit cycle a plurality of times, the unit cycle including an atomic layer deposition (ALD) process for forming a conductive layer on the gate insulating layer to serve as the buried gate electrode layer, and an atomic layer etching (ALE) process for preferentially etching portions of the conductive layer formed near the one or more trenches and portions of the conductive layer formed on upper ends of the one or more trenches over other portions of the conductive layer inside the one or more trenches.

The semiconductor device may further include a hard mask layer formed on the semiconductor substrate outside the one or more trenches to further define the one or more trenches.

The buried gate electrode layer may further include a polysilicon layer formed on the conductive layer to fill the one or more trenches.

According to another aspect of the present invention, there is provided a method of manufacturing a semiconductor device, the method including steps of providing a semiconductor substrate having one or more trenches defined by a hard mask layer, forming a gate insulating layer on the semiconductor substrate inside the one or more trenches, and forming a buried gate electrode layer on the gate insulating layer to at least partially fill the one or more trenches, wherein the step of forming the buried gate electrode layer includes steps of repeating a unit cycle a plurality of times, the unit cycle including an atomic layer deposition (ALD) process for forming a conductive layer on the gate insulating layer and the hard mask layer to serve as the buried gate electrode layer, and an atomic layer etching (ALE) process for preferentially etching portions of the conductive layer formed near the one or more trenches and portions of the conductive layer formed on upper ends of the one or more trenches over other portions of the conductive layer inside the one or more trenches, performing wet etching to etch portions of the conductive layer remaining on both side walls at the upper ends of the one or more trenches, and forming a polysilicon layer on the conductive layer to fill the one or more trenches, and wherein the ALE process within the unit cycle includes steps of adsorbing an etchant onto the conductive layer, and removing portions of the conductive layer from the semiconductor substrate by activating portions of the etchant adsorbed onto the conductive layer by supplying ions onto the conductive layer in a direction perpendicular to the semiconductor substrate.

The ions supplied during the ALE process may have an energy lower than or equal to 10 eV (and higher than 0 eV), and, in the step of removing the portions of the conductive layer, the ions may activate portions of the etchant adsorbed onto the conductive layer near the one or more trenches, portions of the etchant adsorbed onto the conductive layer on upper side walls of the one or more trenches, and portions of the etchant adsorbed onto the conductive layer on lower ends of the one or more trenches, based on an ion bombardment effect, and the activated portions of the etchant may preferentially remove portions of the conductive layer near the one or more trenches, portions of the conductive layer on the upper side walls of the one or more trenches, and portions of the conductive layer on the lower ends of the one or more trenches over other portions of the conductive layer.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
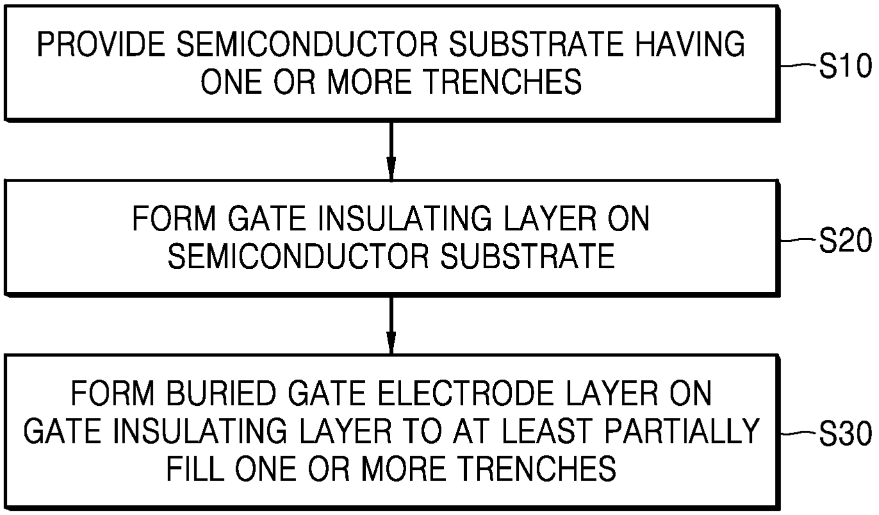
FIG. 1 is a flowchart of a method of manufacturing a semiconductor device, according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
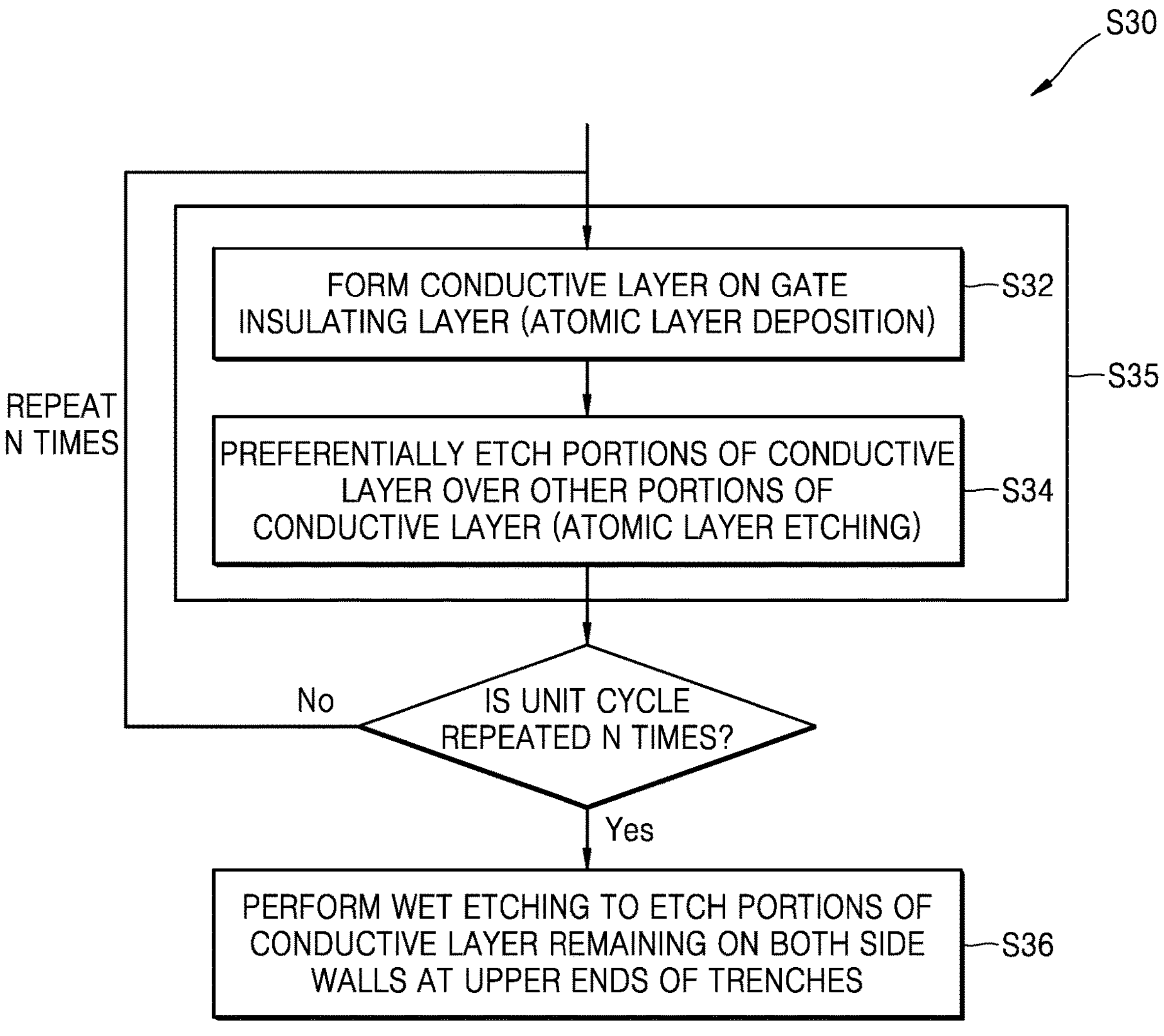
FIG. 2 is a flowchart of a step of forming a buried gate electrode layer in the method of FIG. 1.

FIGS. 1 and 2 are flowcharts of a method of manufacturing a semiconductor device, according to an embodiment of the present invention, and FIGS. 3 to 12 are cross-sectional views showing a method of manufacturing a semiconductor device, according to an embodiment of the present invention.

Figure 3:
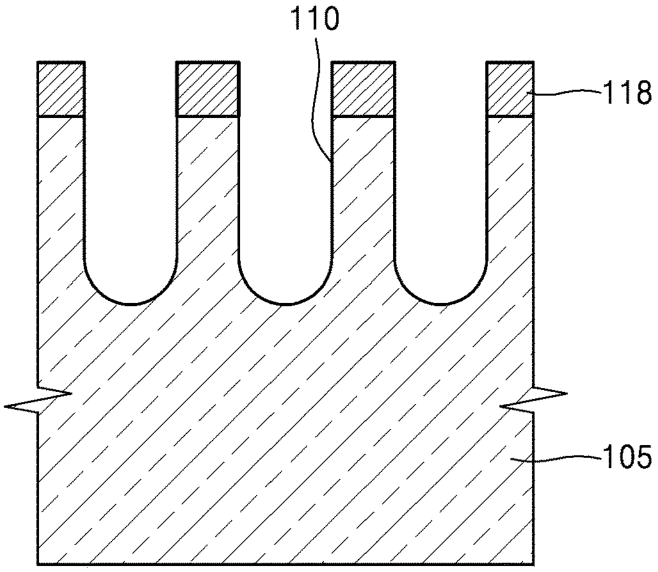
FIGS. 3 to 12 are cross-sectional views showing a method of manufacturing a semiconductor device, according to an embodiment of the present invention.

Referring to FIGS. 1 and 3, a semiconductor substrate 105 having one or more trenches 110 may be provided (S10). The number of trenches 110 may be appropriately selected and does not limit the scope of the current embodiment.

The semiconductor substrate 105 may refer to a substrate including a semiconductor material, e.g., silicon (Si), germanium (Ge), or silicon-germanium (Si—Ge). The semiconductor material in the semiconductor substrate 105 may have a monocrystalline structure and further include epitaxial layers in addition to the bulk monocrystalline structure. The semiconductor substrate 105 may have various shapes, e.g., a wafer shape. In some embodiments, it may be understood that the semiconductor substrate 105 includes a semiconductor material and further includes a stacked structure formed on the semiconductor material.

More specifically, a plurality of trenches 110 may be formed in the semiconductor substrate 105 by using photolithography and etching. In some embodiments, edge etching may be additionally performed to round bottom edges of the trenches 110. As such, lower portions of the trenches 110 may have a U shape. This shape may prevent concentration of an electric field at the edges of the trenches 110.

In some embodiments, a hard mask layer 118 may be formed on the semiconductor substrate 105 outside the trenches 110. For example, the hard mask layer 118 may be formed as an etch mask to form the trenches 110, and remain thereafter. As such, the trenches 110 may be further defined by the hard mask layer 118. For example, the hard mask layer 118 may include an oxide layer, an oxynitride layer, or a nitride layer. Meanwhile, for example, an antireflection layer and/or an amorphous carbon layer (ACL) may be further formed on the hard mask layer 118 to form the trenches 110, and removed after the trenches 110 are formed.

Figure 4:
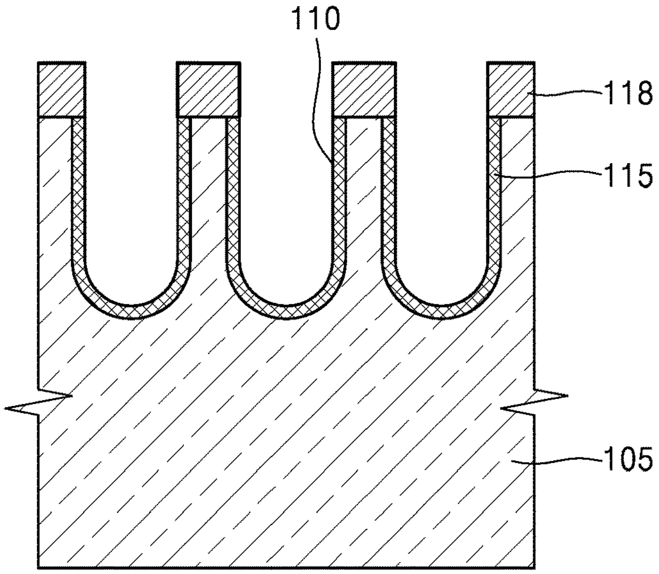

Then, referring to FIG. 4, a gate insulating layer 115 may be formed on the semiconductor substrate 105 (S20). For example, the gate insulating layer 115 may be formed on the semiconductor substrate 105 inside the trenches 110. More specifically, the gate insulating layer 115 may be formed by forming an oxide layer by thermally oxidizing the semiconductor substrate 105. As another example, the gate insulating layer 115 may be formed by forming an insulating layer on the semiconductor substrate 105 by using chemical vapor deposition (CVD). In some embodiments, when the semiconductor substrate 105 is a silicon wafer, the gate insulating layer 115 may include a silicon oxide layer.

Thereafter, referring to FIGS. 1 to 12, a buried gate electrode layer 125 may be formed on the gate insulating layer 115 to at least partially fill the one or more trenches 110 (S30).

More specifically, as shown in FIG. 2, the step S30 of forming the buried gate electrode layer 125 may be performed by repeating a unit cycle S35 a plurality of times. For example, the buried gate electrode layer 125 may be formed by repeating the unit cycle S35 N times. The number N of repetitions may be appropriately selected in consideration of a width and a depth of the trenches 110.

For example, as shown in FIGS. 2 and 5 to 10, the unit cycle S35 may include an atomic layer deposition (ALD) process S32 for forming a conductive layer 120 on the gate insulating layer 115, and an atomic layer etching (ALE) process S34 for preferentially etching portions of the conductive layer 120 formed near the trenches 110 and portions of the conductive layer 120 formed on upper ends of the trenches 110 over the other portions of the conductive layer 120 inside the trenches 110.

For example, the ALD process S32 may be performed by repeating a deposition cycle one or more times, the deposition cycle including steps of providing a source gas onto the semiconductor substrate 105, providing a first purge gas onto the semiconductor substrate 105, providing a reaction gas onto the semiconductor substrate 105, and providing a second purge gas onto the semiconductor substrate 105. In the step of providing the source gas, the source gas may be adsorbed onto the semiconductor substrate 105 having the trenches 110, and then react with the reaction gas to form the conductive layer 120.

In some embodiments, in the ALD process S32 within the unit cycle S35, the conductive layer 120 may be formed on the entirety of the semiconductor substrate 105 including the inside and outside of the trenches 110 and formed with a small thickness to prevent contact between portions thereof on both side walls at the upper ends of the trenches 110. For example, a time of the ALD process S32 may be adjusted in such a manner that the portions of the conductive layer 120 on both side walls at the upper ends of the one or more trenches 110 are not in contact with but spaced apart from each other. Furthermore, the deposition cycle for forming the conductive layer 120 in the ALD process S32 may be repeated one or more times in consideration of the thickness.

In some embodiments, the conductive layer 120 may include a metal such as tungsten (W), the source gas in the ALD process S32 may include a metal-containing gas, and the reaction gas may include a hydrogen (H)-containing gas. For example, when the conductive layer 120 includes W, the source gas may include $WF_6$ gas and the reaction gas may include $H_2$ gas or $B_2H_6$ gas. Furthermore, the first and second purge gases may include an inert gas, e.g., $N_2$ gas or argon (Ar) gas.

Figure 5:
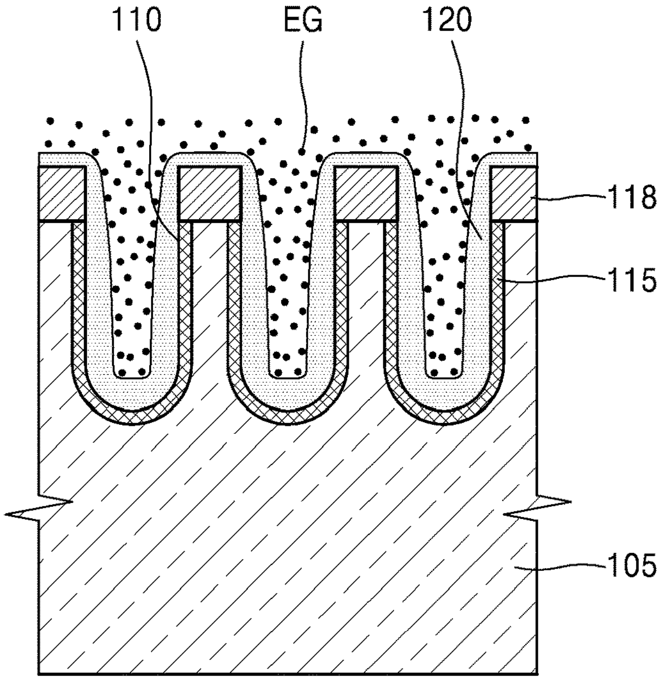
Figure 6:
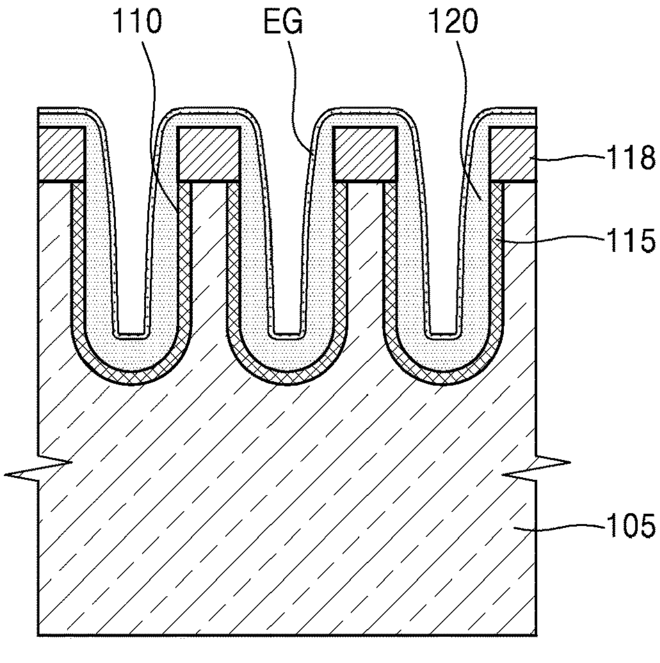
Figure 7:
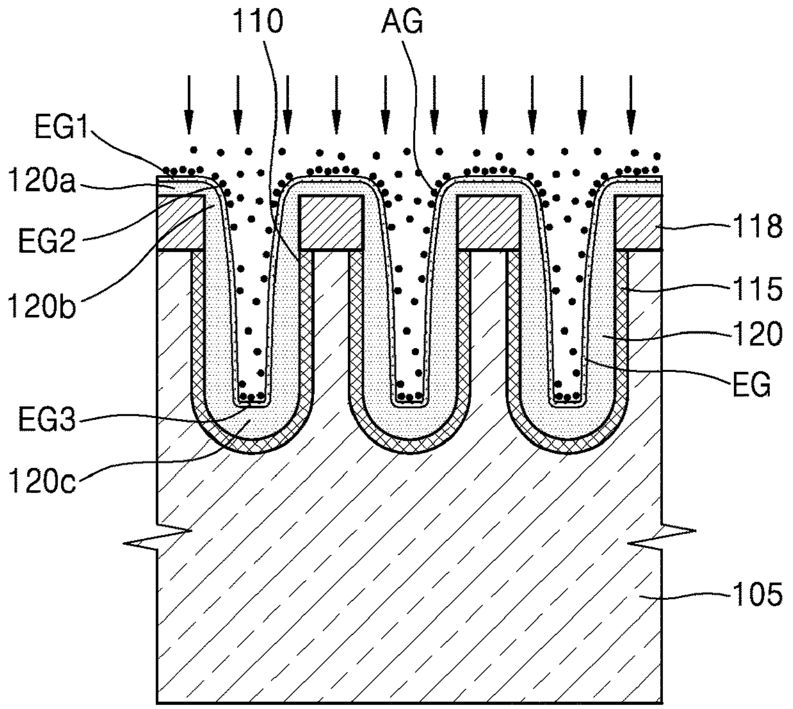
Figure 8:
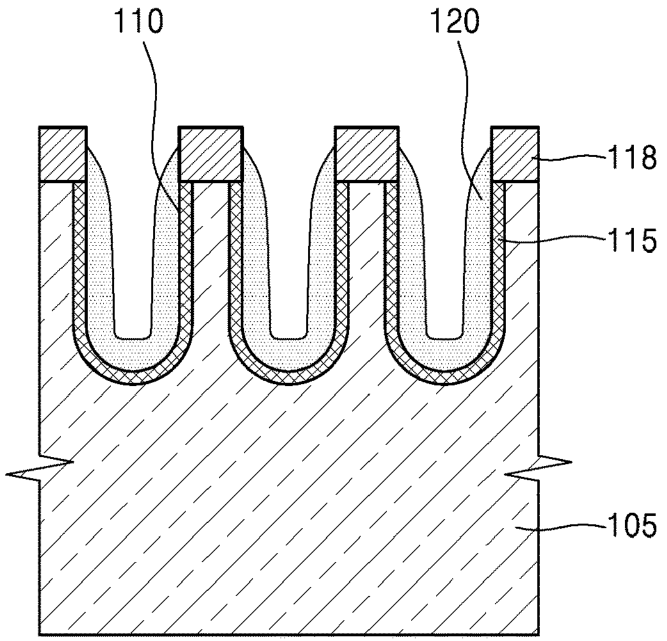

The ALE process S34 may include a step of adsorbing an etchant EG onto the conductive layer 120 as shown in FIGS. 5 and 6, and a step of removing portions of the conductive layer 120 from the semiconductor substrate 105 by activating portions of the adsorbed etchant EG by supplying ions AG onto the conductive layer 120 as shown in FIGS. 7 and 8.

Furthermore, in the ALE process S34, the step of adsorbing the etchant EG may include a step of supplying the first purge gas onto the semiconductor substrate 105 after the step of supplying the etchant EG to remove the remaining etchant EG, and the step of removing the portions of the conductive layer 120 may further include a step of supplying the second purge gas onto the semiconductor substrate 105 after the step of supplying the ions AG onto the semiconductor substrate 105 to remove by-products.

The etchant EG may be adsorbed onto the surface of the conductive layer 120 in the step of adsorbing the etchant EG, and activated based on an ion bombardment effect by the supplied ions AG in the step of removing the portions of the conductive layer 120. For example, the ions AG may be incident on the conductive layer 120 in a direction perpendicular to the semiconductor substrate 105.

As such, in the step of removing the portions of the conductive layer 120, the ions AG may activate the portions of the etchant EG adsorbed onto the portions of the conductive layer 120 disposed in a direction perpendicular to the semiconductor substrate 105, based on an ion bombardment effect. More specifically, the ions AG may selectively activate an etchant EG1 adsorbed onto a conductive layer 120*a* on the hard mask layer 118 near the trenches 110, an etchant EG2 adsorbed onto a conductive layer 120*b* on upper side walls of the trenches 110, and/or an etchant EG3 adsorbed onto a conductive layer 120*c* on lower ends of the trenches 110.

In some embodiments, the ions AG may have a low energy lower than or equal to eV (and higher than 0 eV) to reduce damage applied to the semiconductor substrate 105. As such, damage or abrasion of the gate insulating layer 115 and the hard mask layer 118 may be reduced and ion damage applied to the semiconductor substrate 105 may also be reduced.

The selectively activated etchants EG1, EG2, and EG3 may selectively etch portions of the conductive layer 120 thereunder. Therefore, during the ALE process S34, portions of the conductive layer 120 formed near the trenches 110 and portions of the conductive layer 120 formed on the upper ends of the trenches 110 may be preferentially etched over the other portions of the conductive layer 120 inside the trenches 110. Although portions of the conductive layer 120 on the bottom surfaces of the trenches 110 may also be etched, when the trenches 110 have a U shape, the bottom surfaces may be curved and thus the etched portions may be relatively small. More specifically, the selectively activated etchants EG1, EG2, and EG3 may preferentially remove portions of the conductive layer 120, e.g., the conductive layer 120*a* on the hard mask layer 118, the conductive layer 120*b* on the upper side walls of the trenches 110, and/or the conductive layer 120*c* on the lower ends of the trenches 110, over the other portions of the conductive layer 120.

In some embodiments, the etchant EG may include a halogen-containing gas. For example, the etchant EG may include a fluorine (F)-containing gas or a chlorine (Cl)-containing gas. Furthermore, the ions AG may include an inert gas that provides energy to but does not react with the etchant EG, e.g., Ar gas. The first and second purge gases may include an inert gas, e.g., $N_2$ gas or Ar gas.

In some embodiments, the number of deposition cycles of the ALD process S32 and the number of etching cycles of the ALE process S34 within the unit cycle S35 may be appropriately adjusted.

Figure 9:
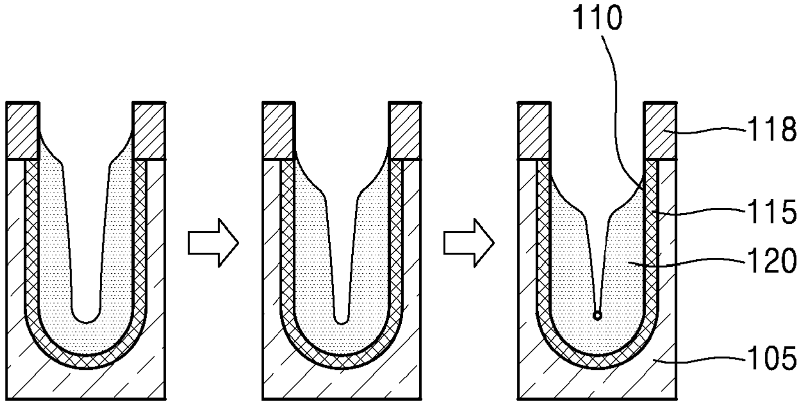

As shown in FIG. 9, due to the repetition of the unit cycle S35, the conductive layer 120 may become thicker to gradually fill the trenches 110. However, because the ALD process S32 and the ALE process S34 are alternately performed, the conductive layer 120 is repeatedly deposited on and etched from the upper side walls of the trenches 110. As such, the upper ends of the trenches 110 may remain open while the trenches 110 are being filled.

As described above, because the ALE processes S34 are added between the ALD processes S32 to form the conductive layer 120, a deposition process for repeating the above-described unit cycle S35 may be called an etch assisted cyclic fill (EACF) process or an etch assisted cyclic deposition (EACD) process.

Figure 10:
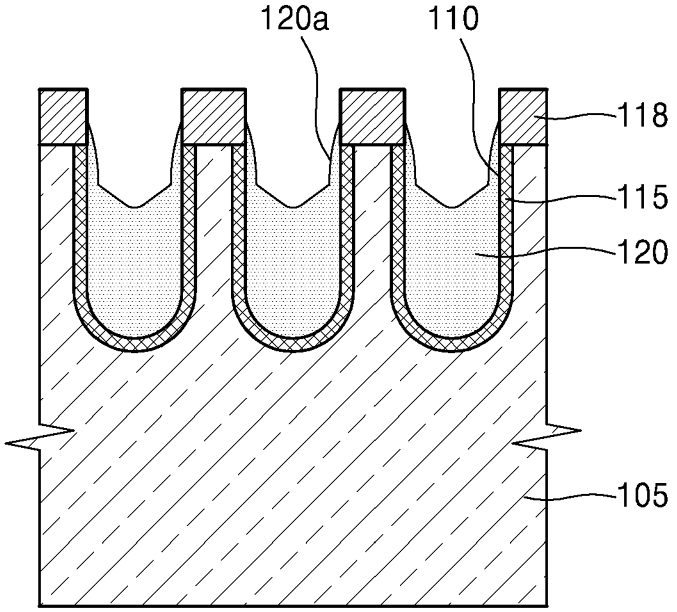

As shown in FIG. 10, the lower portions of the trenches 110 may be completely filled and, in this case, the upper ends of the trenches 110 may still remain open. In some embodiments, the conductive layer 120 may remain with a small thickness on the upper side walls of the trenches 110 depending on an amount etched in the ALE process S34, and the thickness thereof may gradually decrease in an upward direction. Therefore, by repeating the unit cycle S35 without additionally performing plasma etching, the conductive layer 120 may be filled in the lower portions of the trenches 110 while the upper ends of the trenches 110 are open.

Figure 11:
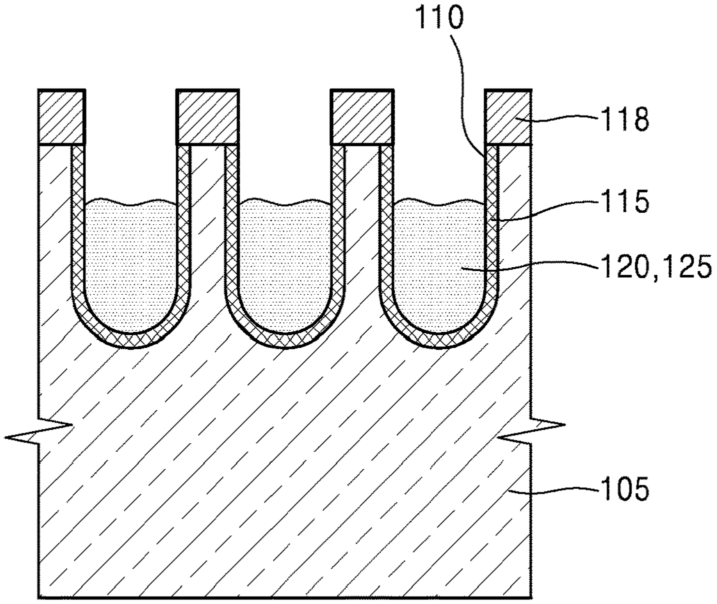

As shown in FIGS. 2 and 11, a step S36 of performing wet etching to etch the portions 120*a* of the conductive layer 120 remaining on both side walls at the upper ends of the one or more trenches 110 may be further included after the step of repeating the unit cycle S35 the plurality of times. For example, the wet etching may be performed using an etching solution for etching metal, e.g., a sulfuric peroxide mixture (SPM) solution. As such, the conductive layer 120 filling the lower portions of the trenches 110 may be formed as the buried gate electrode layer 125.

Therefore, the buried gate electrode layer 125 may fill the trenches 110 from the bottom surfaces toward the upper ends of the trenches 110 and be formed only to a certain depth from the upper ends of the trenches 110. In this sense, the buried gate electrode layer 125 may have a structure buried in the trenches 110.

According to the afore-described embodiments, because the conductive layer 120 serving as the buried gate electrode layer 125 is limitedly formed in the trenches 110 and the thickness of the conductive layer 120 is reduced compared to general cases, consumption of a metal source may be reduced and stress in the conductive layer 120 may be lowered. Furthermore, according to the afore-described embodiments, because a step of thickly depositing and then planarizing the conductive layer 120 as in the general cases is omitted, productivity may be increased and costs may be reduced.

Figure 12:
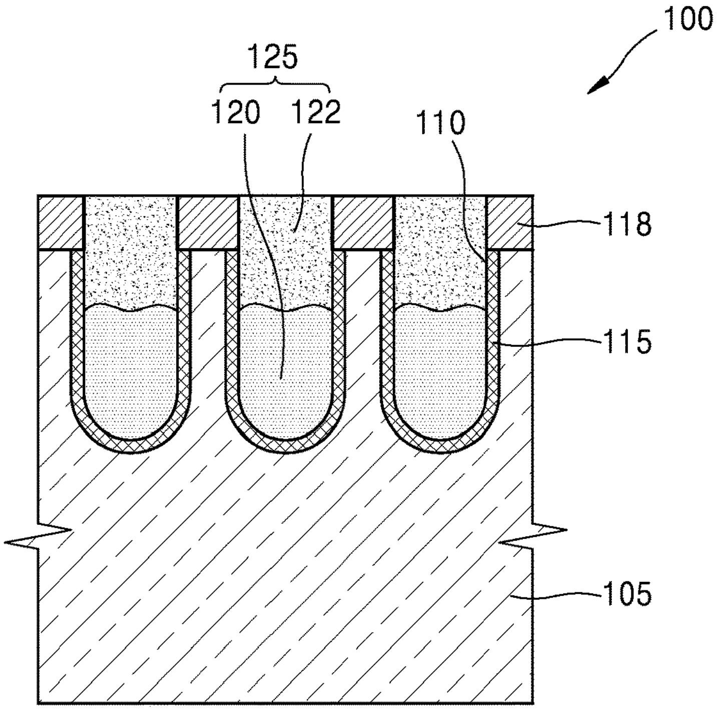

In some embodiments, as shown in FIG. 12, the buried gate electrode layer 125 may further include another conductive layer, e.g., a polysilicon layer 122, formed on the conductive layer 120 to fill the trenches 110. The polysilicon layer 122 may be doped with n-type or p-type impurities. For example, the step of forming the buried gate electrode layer 125 may further include a step of forming the polysilicon layer 122 to fill the trenches 110 by depositing the polysilicon layer 122 on the conductive layer 120 and planarizing the polysilicon layer 122.

Figure 13:
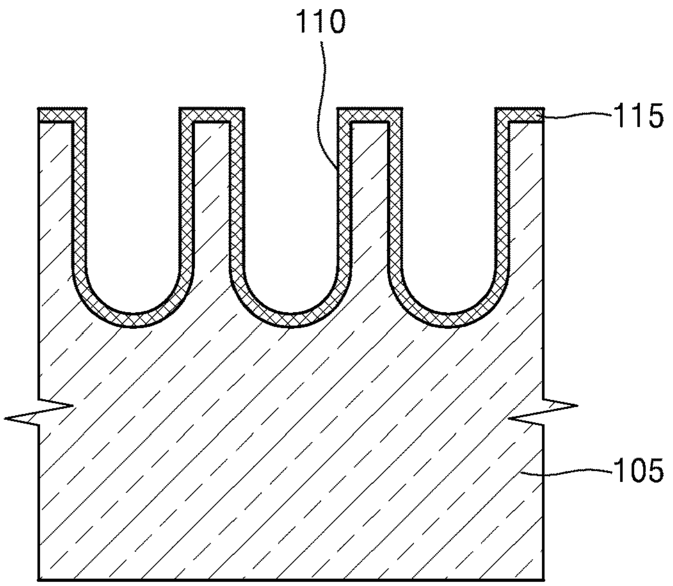
FIGS. 13 and 14 are cross-sectional views showing a method of manufacturing a semiconductor device, according to another embodiment of the present invention.
Figure 14:
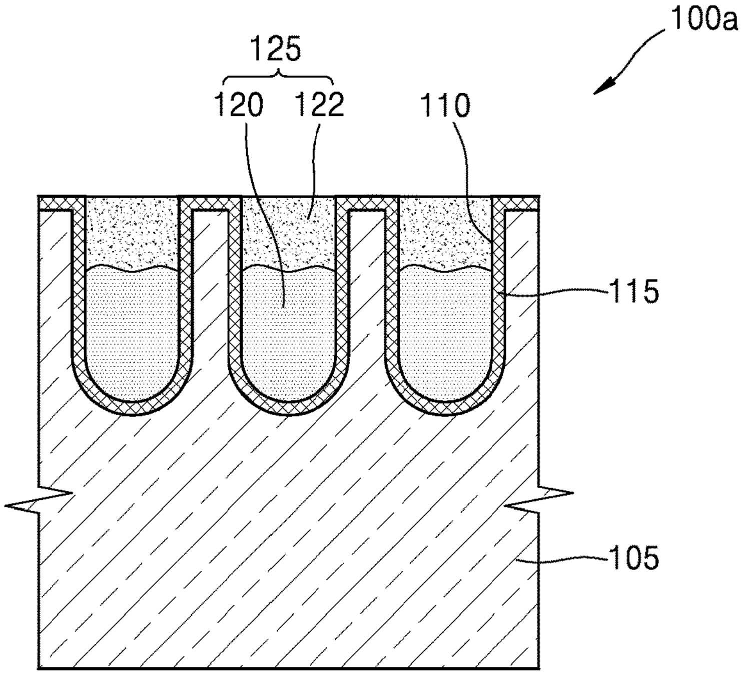

FIGS. 13 and 14 are cross-sectional views showing a method of manufacturing a semiconductor device 100*a*, according to another embodiment of the present invention. The method according to the current embodiment is partially modified from the method according to the previous embodiment of FIGS. 3 to 12, and a repeated description between the two embodiments is not provided herein.

Referring to FIG. 13, the gate insulating layer 115 may be formed on the entirety of the semiconductor substrate 105. For example, the hard mask layer 118 may be omitted from FIG. 3, and the gate insulating layer 115 may be formed on the semiconductor substrate 105 having the trenches 110.

Thereafter, referring to FIGS. 5 to 12, the buried gate electrode layer 125 may be formed in the same manner. In the semiconductor device 100*a*, the polysilicon layer 122 may be planarized to the same height as the semiconductor substrate 105 near the trenches 110 or as the gate insulating layer 115 on the semiconductor substrate 105.

The structure and manufacturing method of the semiconductor device 100*a* are the same as those of the above-described semiconductor device 100 except that the hard mask layer 118 is not present and the gate insulating layer 115 is further formed in place of the hard mask layer 118.

For example, the conductive layer 120 may be formed on inner surfaces of the trenches 110 as shown in FIG. 5 and further formed on the gate insulating layer 115 near the trenches 110. Furthermore, the etchant EG may be adsorbed onto the conductive layer 120 as shown in FIG. 6 and, in the step of removing the portions of the conductive layer 120, the etchant EG1 adsorbed onto the conductive layer 120*a* near the trenches 110, the etchant EG2 adsorbed onto the conductive layer 120*b* on the upper side walls of the trenches 110, and/or the etchant EG3 adsorbed onto the conductive layer 120*c* on the lower ends of the trenches 110 may be activated by the ions AG as shown in FIG. 7. Thereafter, as shown in FIG. 8, the activated etchants EG1, EG2, and EG3 may preferentially remove the conductive layer 120*a* near the trenches 110, the conductive layer 120*b* on the upper side walls of the trenches 110, and/or the conductive layer 120*c* on the lower ends of the trenches 110 over the other portions of the conductive layer 120.

The conductive layer 120 is buried in the trenches 110 through the above-described steps and then the polysilicon layer 122 is formed to form the buried gate electrode layer 125.

Referring to the above description, in some embodiments of the present invention, the semiconductor device 100 or 100*a* may include the semiconductor substrate 105 having the one or more trenches 110, the gate insulating layer 115 formed on the semiconductor substrate 105 inside the one or more trenches 110, and the buried gate electrode layer 125 formed on the gate insulating layer 115 to at least partially fill the one or more trenches 110.

The buried gate electrode layer 125 may be formed by repeating the unit cycle S35 a plurality of times, the unit cycle S35 including the ALD process S32 for forming the conductive layer 120 on the gate insulating layer 115 to serve as the buried gate electrode layer 125, and the ALE process S34 for preferentially etching the portions of the conductive layer 120 formed near the one or more trenches 110 and the portions of the conductive layer 120 formed on the upper ends of the one or more trenches 110 over the other portions of the conductive layer 120 inside the one or more trenches 110. Furthermore, the buried gate electrode layer 125 may further include the polysilicon layer 122 formed on the conductive layer 120 to fill the one or more trenches 110.

In some embodiments of the present invention, the buried gate electrode layer 125 may further include the polysilicon layer 122 formed on the conductive layer 120 to fill the trenches 110.

In some embodiments of the present invention, source and drain regions (not shown) may be formed on the semiconductor substrate 105 at both sides of the buried gate electrode layer 125. For example, the source and drain regions may be formed by implanting impurities into the semiconductor substrate 105. A metal wiring structure connected to the buried gate electrode layer 125 and the source and drain regions may be further formed on the semiconductor substrate 105.

In some embodiments, the semiconductor device 100 may further include the hard mask layer 118 formed on the semiconductor substrate 105 outside the trenches 110 to further define the trenches 110.

In some embodiments of the present invention, a capacitor structure may be further formed on the semiconductor substrate 105 and, in this case, the semiconductor device 100 may be understood as a memory device, e.g., dynamic random-access memory (DRAM).

The above-described semiconductor device 100 or 100*a* may be understood as having a recess gate structure, a recess channel array transistor (RCAT) structure, or a buried channel array transistor (BCAT) structure.

According to the above-described semiconductor device 100 or 100*a* and the method of manufacturing the same, using an etch assisted cyclic fill (EACF) process, a planarization process for the conductive layer 120 and a reactive ion etching (RIE) process may be omitted and thus manufacturing costs may be reduced. Furthermore, because plasma etching is omitted, plasma damage applied to the semiconductor substrate 105 and the structure thereof may be prevented. In addition, due to the EACF process, a conformal profile of the conductive layer 120 may be achieved compared to general cases.

Based on the semiconductor device and the method of manufacturing the same, according to the afore-described embodiments of the present invention, a highly reliable semiconductor device capable of lowering process costs and reducing substrate damage may be manufactured. However, the scope of the present invention is not limited to the above effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A method of manufacturing a semiconductor device, the method comprising steps of:

providing a semiconductor substrate having one or more trenches defined by a hard mask layer;

forming a gate insulating layer on the semiconductor substrate inside the one or more trenches; and forming a buried gate electrode layer on the gate insulating layer to at least partially fill the one or more trenches, wherein the step of forming the buried gate electrode layer comprises steps of: repeating a unit cycle a plurality of times, the unit cycle comprising an atomic layer deposition (ALD) process for forming a conductive layer on the gate insulating layer and the hard mask layer to serve as the buried gate electrode layer, and an atomic layer etching (ALE) process for preferentially etching portions of the conductive layer formed near the one or more trenches and portions of the conductive layer formed on upper ends of the one or more trenches over other portions of the conductive layer inside the one or more trenches, and results in a lower portion of each trench being fully filled between opposite side walls and an upper end of each trench being only partially filled so that portions of the conductive layer remain on the opposite side walls and are spaced apart from each other at the upper ends of the one or more trenches;

performing wet etching to etch the portions of the conductive layer remaining on the opposite side walls at the upper ends of the one or more trenches; and forming a polysilicon layer on the conductive layer remaining in the lower portion of each trench to fill the one or more trenches, and wherein the ALE process within the unit cycle comprises steps of:

adsorbing an etchant onto the conductive layer; and removing portions of the conductive layer from the semiconductor substrate by activating portions of the etchant adsorbed onto the conductive layer by supplying ions onto the conductive layer in a direction perpendicular to the semiconductor substrate.

2. The method of claim 1, wherein the step of adsorbing the etchant comprises a step of supplying a first purge gas onto the semiconductor substrate after the step of supplying the etchant onto the semiconductor substrate, and wherein the step of removing the portions of the conductive layer comprises a step of supplying a second purge gas onto the semiconductor substrate after the step of supplying the ions onto the semiconductor substrate.

3. The method of claim 1, wherein, in the step of repeating the unit cycle the plurality of times, a time of the ALD process within the unit cycle is adjusted in such a manner that portions of the conductive layer on the opposite side walls at the upper ends of the one or more trenches are not in contact with but spaced apart from each other.

4. The method of claim 1, wherein the ions supplied during the ALE process have an energy lower than or equal to 10 eV (and higher than 0 eV), and wherein, in the step of removing the portions of the conductive layer, the ions activate portions of the etchant adsorbed onto the conductive layer near the one or more trenches, portions of the etchant adsorbed onto the conductive layer on upper side walls of the one or more trenches, and portions of the etchant adsorbed onto the conductive layer on lower ends of the one or more trenches, based on an ion bombardment effect, and the activated portions of the etchant preferentially remove portions of the conductive layer near the one or more trenches, portions of the conductive layer on the upper side walls of the one or more trenches, and portions of the conductive layer on the lower ends of the one or more trenches over other portions of the conductive layer.

* * * * *